(12) United States Patent
Jeter et al.

(10) Patent No.: US 11,960,739 B1
(45) Date of Patent: Apr. 16, 2024

(54) NOMINAL DISTANCE REFERENCE VOLTAGE CALIBRATION

(71) Applicant: Apple Inc., Cupertino, CA (US)

(72) Inventors: Robert E. Jeter, Santa Clara, CA (US); Jingkui Zheng, Sunnyvale, CA (US); David A. Knopf, San Jose, CA (US); Satish B. Dulam, Sunnyvale, CA (US); Kai Lun Hsiung, Fremont, CA (US); Venkata Ramana Malladi, Santa Clara, CA (US); Rahul Ranjan, Campbell, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/929,191

(22) Filed: Sep. 1, 2022

(51) Int. Cl.
   *G06F 3/06* (2006.01)
   *G11C 7/22* (2006.01)

(52) U.S. Cl.
   CPC .......... *G06F 3/0632* (2013.01); *G06F 3/0614* (2013.01); *G06F 3/0658* (2013.01); *G06F 3/0673* (2013.01); *G11C 7/22* (2013.01); *G11C 2207/2254* (2013.01)

(58) Field of Classification Search
   None
   See application file for complete search history.

(56) References Cited

U.S. PATENT DOCUMENTS

| | | | |
|---|---|---|---|
| 9,305,622 B1 | 4/2016 | Jeter | |
| 9,672,882 B1* | 6/2017 | Jeter | G11C 7/1093 |
| 9,990,973 B1* | 6/2018 | Jeter | G06F 13/1689 |
| 10,083,736 B1 | 9/2018 | Jeter et al. | |
| 10,134,455 B2 | 11/2018 | Bialas, Jr. et al. | |
| 10,408,863 B2 | 9/2019 | Jeter et al. | |

* cited by examiner

*Primary Examiner* — Kevin Verbrugge
(74) *Attorney, Agent, or Firm* — Kowert, Hood, Munyon, Rankin & Goetzel, P.C.; Dean M. Munyon

(57) ABSTRACT

The present disclosure is directed to a reference voltage calibration. An apparatus includes a memory and a memory controller including a calibration circuit configured to perform a reference voltage calibration to determine a reference voltage used to distinguish between logic values read from the memory. The reference voltage calibration comprises performing horizontal calibrations at different reference voltage values to determine a range of delay values applied to a data strobe signal at which valid data is read from the memory. The calibration includes determining scores corresponding to ones of the plurality of horizontal calibrations in which a score for a particular one of the plurality of horizontal calibrations is based on a corresponding range of delay values and a reference voltage margin. Thereafter, the calibration circuit selects a calibrated reference voltage based on the scores corresponding to ones of the plurality of horizontal calibrations.

20 Claims, 7 Drawing Sheets

NOMINAL DISTANCE REFERENCE VOLTAGE CALIBRATION

BACKGROUND

Technical Field

This disclosure is directed to memory subsystems, and more particularly, calibrations performed in memory subsystems.

Description of the Related Art

Eye patterns, or eye diagrams, are graphic illustrations that illustrate times and amplitudes at which a digital signal can be sampled at its correct value. In various types of systems that include data transmissions, it is desirable to sample signals (e.g., data signals synchronized by a clock signal) near a center of an eye, in terms of time and sampling voltage. In terms of timing, this can provide a signal with a sufficient amount of both setup and hold time, while also rendering it less susceptible to noise. In terms of voltage, this can enable a more accurate determination of a logic value (e.g., logic 1 or logic 0) based on a reference voltage used to distinguish one from the other.

In memory subsystems, calibrations may be performed to determine the points at which signals are sampled within the eye pattern. Calibrations are performed to determine an eye diagram that enables accurate sampling of signals, and thus include calibrations based both on the timing (sometimes referred to as a horizontal calibration) and sampling reference voltage (sometimes referred to as a vertical calibration). Performing these calibrations typically includes adjusting a number of different parameters that govern transmission of data between a memory controller and a memory. These parameters include a delay applied to a data strobe signal during the horizontal calibrations. A vertical calibration may include a number of horizontal calibrations performed at different reference voltages. Such calibrations may be performed during a system startup, and may also be performed on a periodic basis thereafter. Calibrations may also be performed in response to changes of a performance state.

SUMMARY

The present disclosure is directed to a reference voltage calibration based on a difference from a nominal reference voltage. In one embodiment, an apparatus includes a memory and a memory controller coupled thereto. The memory controller includes a calibration circuit configured to perform a reference voltage calibration to determine a reference voltage used to distinguish between logic values read from the memory. The reference voltage calibration comprises performing a plurality of horizontal calibrations at different reference voltage values in which a determination is made of a range of delay values applied to a data strobe signal at which valid data is read from the memory. The calibration includes determining scores corresponding to ones of the plurality of horizontal calibrations in which a score for a particular one of the plurality of horizontal calibrations is based on a corresponding range of delay values and a reference voltage margin. Thereafter, the calibration circuit selects a calibrated reference voltage based on the scores corresponding to ones of the plurality of horizontal calibrations.

In one embodiment, the scoring comprises assigning scores based both on the width of the range of delay values at a particular reference voltage, as well as the distance of the reference voltage from the nominal reference voltage. The score increases as the range of delay values increases. However the score is reduced (or penalized) with increases in the distance between a particular reference voltage and a nominal reference voltage. The operating reference voltage is selected as a reference voltage that has the highest score based on both the width of the range and the distance from the nominal reference voltage.

BRIEF DESCRIPTION OF THE DRAWINGS

The following detailed description makes reference to the accompanying drawings, which are now briefly described.

DETAILED DESCRIPTION OF EMBODIMENTS

Figure 1:
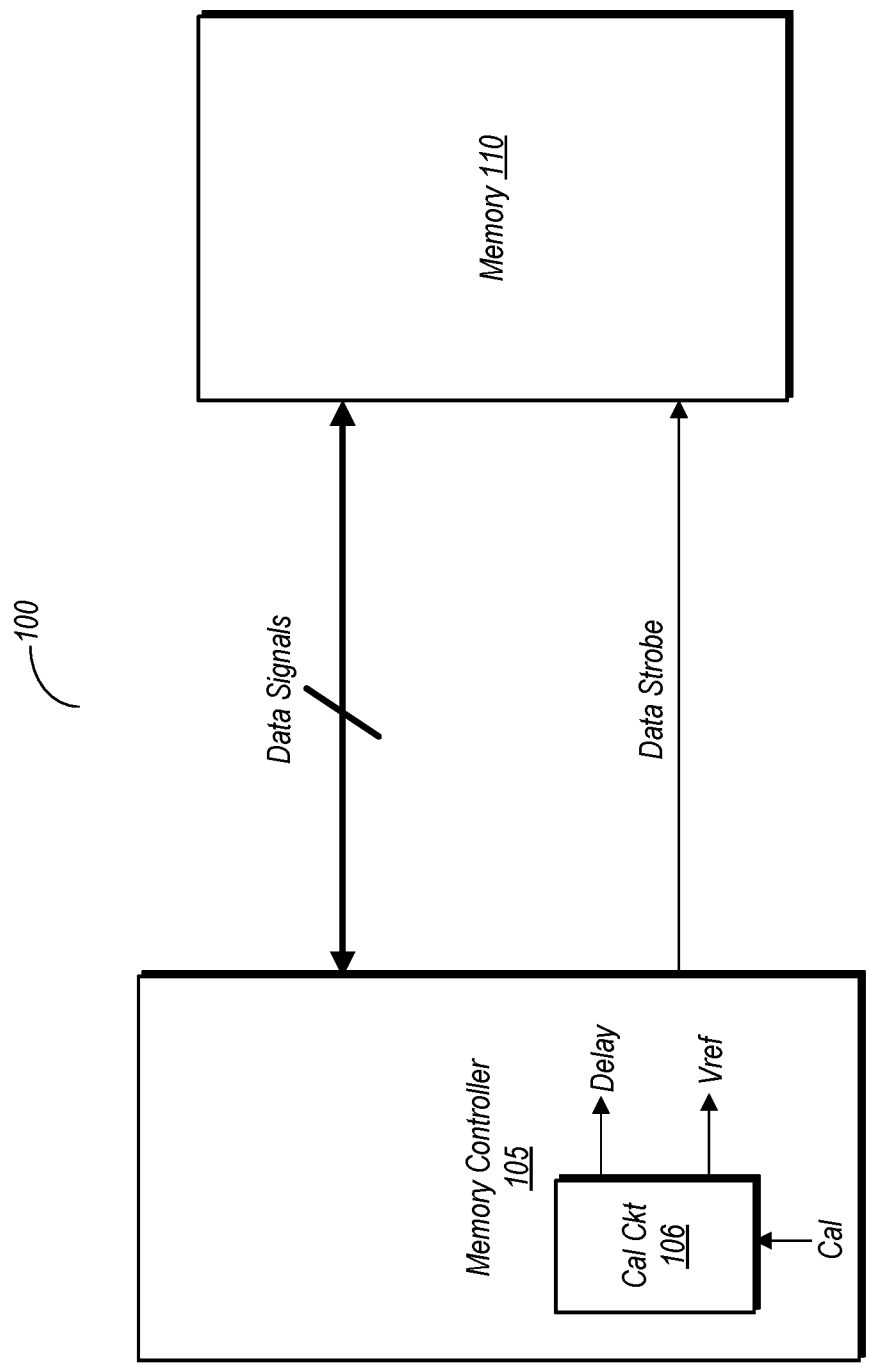
FIG. 1 is a block diagram of one embodiment of a memory subsystem.

The present disclosure is directed to the calibration of a reference voltage used in a memory subsystem, wherein the reference voltage is used to distinguish between a logic 1 and logic 0. Various schemes exist for performing calibrations to determine the best reference voltage to be used during subsequent operation. It is desirable to use the reference voltage having the widest voltage margin. Ideally, in a "diamond-shaped" eye pattern, the reference voltage having the widest voltage margin will be at a value which also has the widest timing margin. However, in some cases, the eye pattern may have an irregular shape, and thus the reference voltage with the optimal voltage margin may not coincide with a point having the optimal timing margin (with regard to the amount of delay applied to a data strobe signal), and vice versa. For example, in a bell-shaped eye pattern, the reference voltage occurring at a point having an optimal timing margin may have a low voltage margin relative to the optimal voltage margin. Thus, an irregularly shaped eye pattern can significantly complicate selecting an optimal sampling point in the eye pattern.

The present disclosure makes use of the insight gained by recognition of this problem and implements a calibration method based on the distance of a reference voltage from a nominal reference voltage. The nominal reference voltage may be that which has a sufficient voltage margin both above and below that point. The method includes performing a reference voltage calibration, where the reference voltage calibration comprises a number of horizontal (timing) calibrations. A given horizontal calibration may be performed at a particular reference voltage by varying an amount of delay applied to a data strobe signal used to synchronize transfers of data over a range of values and determining the range at which passing data is returned from the memory. For each horizontal calibration performed at a particular reference voltage value, a score is assigned, with higher scores corresponding to wider ranges in which valid data is returned. After performing the horizontal calibrations at the various reference voltages, the scores are adjusted by a penalty value that corresponds to a distance from a nominal reference voltage.

Accordingly, scores associated with reference voltages farther from the nominal reference voltage are reduced more than those closer to the nominal reference voltage. Thereafter, the reference voltage having the largest score may be chosen as the operating reference voltage.

The disclosure further contemplates performing a background calibration in parallel with the reference voltage calibration. In various embodiments, a ring oscillator is implemented that is used for scaling a write data strobe in response to a frequency change (or more generally, a performance state change). Concurrent with performance of the reference voltage calibration described above, the memory controller sends a command to the memory to begin incrementing a counter by the ring oscillator. After some amount of time has elapsed, the memory controller sends another command to the memory to read the count value. After reading the count value, the delay applied to the write clock can be scaled based thereon. If the count value is within a specified range, a full write calibration can be skipped.

The various calibration methods described above may be carried out in a memory subsystem having a memory and a memory controller, wherein the memory controller includes a calibration circuit. The calibration circuit may includes various types of circuitry therein for coordinating the sequence of calibrations while also performing the calculations to determine the operating reference voltage.

Embodiments of the reference voltage calibration method may ensure that a reference voltage is chosen having sufficient voltage margin while also having sufficient timing margin. This methodology may decrease the likelihood of errors when an eye is irregularly shaped. The background calibration method described above may provide time savings by both performing the operation in parallel with another calibration, while potentially eliminating some write calibrations.

The discussion below begins with a description of various embodiments of a memory subsystem. Thereafter, an irregularly-shaped eye pattern is used to describe one embodiment of reference voltage calibration method. Various methods for performing calibration are then described in conjunction with corresponding flow diagram. The discussion concludes with a description of an example system.

Memory Subsystem Embodiments

FIG. 1 is a block diagram of one embodiment of a memory subsystem. In the embodiment shown, memory subsystem 100 includes a memory controller 105 coupled to a memory 110. Memory controller 105 is coupled to memory 110 to allow data signals to be conveyed therebetween during read and write operations. Memory controller 105 is arranged to convey at least one data strobe signal to memory 110. The data strobe signal is a clock signal that is used to synchronize data transfers between memory controller 105 and memory 110. In some embodiments, separate data strobe signals may be provided for read operations and write operations.

Memory controller 105 in the embodiment shown includes calibration circuit 106 that is configured to carry out calibration operations. These calibration operations include horizontal calibrations in which various values of delay are applied to the data strobe signal to determine a range of delays at which valid data can be read from the memory. Valid, or passing, data is defined herein as data that matches expected data, e.g., that which was written to the memory during the performance of the calibration. Calibration circuit 106 is also configured to perform vertical calibrations. A vertical calibration includes the performance of a number of horizontal calibrations, wherein ones of the horizontal calibrations are performed at different values of a reference voltage. Thus, in performing these calibrations, respective ranges of delay and voltage at which valid data is returned from memory 110 is determined. These ranges may, collectively, be graphically illustrated in an eye diagram.

In some cases, the eye diagram may have a "diamond" shape in which the point at which the greatest timing margin is close to or coincides with the point having the greatest amount of voltage margin. In such cases, the sampling point may be performed at or near the center of the eye. However, in some instances, the eye diagram may be irregularly shaped, and there can thus be significant differences between a point at which the delay value has greatest timing margin and a reference voltage which provides the greatest voltage margin. Calibration circuit 106 in the embodiment shown is thus configured to carry out a calibration methodology that performs scoring to determine an operating reference voltage when the eye diagram has an irregular shape.

The vertical calibrations carried out by calibration circuit 106 include determining scores for each of the horizontal calibrations, where the score for a given horizontal calibration is based on the range of delays at which valid data was returned from the memory. Generally speaking, larger ranges of delays correspond to higher scores, with the widest range having the highest score. These scores are initial (or preliminary) scores, and are adjusted in various embodiments of the calibration methodology carried out by calibration circuit 106. In particular, each of the initial scores is adjusted by a penalty factor that corresponds to a reference voltage margin, or distance of a particular reference voltage relative to a nominal reference voltage value. The penalty factor corresponds to an amount of reduction of the score depending on the distance of the particular reference voltage from the nominal reference voltage. Thus, for a horizontal calibration performed at a first reference voltage, the horizontal score is reduced less than for a horizontal calibrations performed at a second reference voltage that is farther from the nominal voltage than the first. These overall, or adjusted scores are computed for each of the reference voltages at which a horizontal calibration was performed. The calibration circuit may then, based on the highest overall score, select a particular reference voltage to be the operating reference voltage that is used during subsequent memory operations.

The penalty factor may be determined in various ways. In one embodiment, the penalty factor is based on a value that linearly (or proportionally) increases as distance from the nominal voltage increases. In another embodiment, the penalty factor is based on a value that exponentially increases as the distance from the nominal voltage increases.

Figure 2:
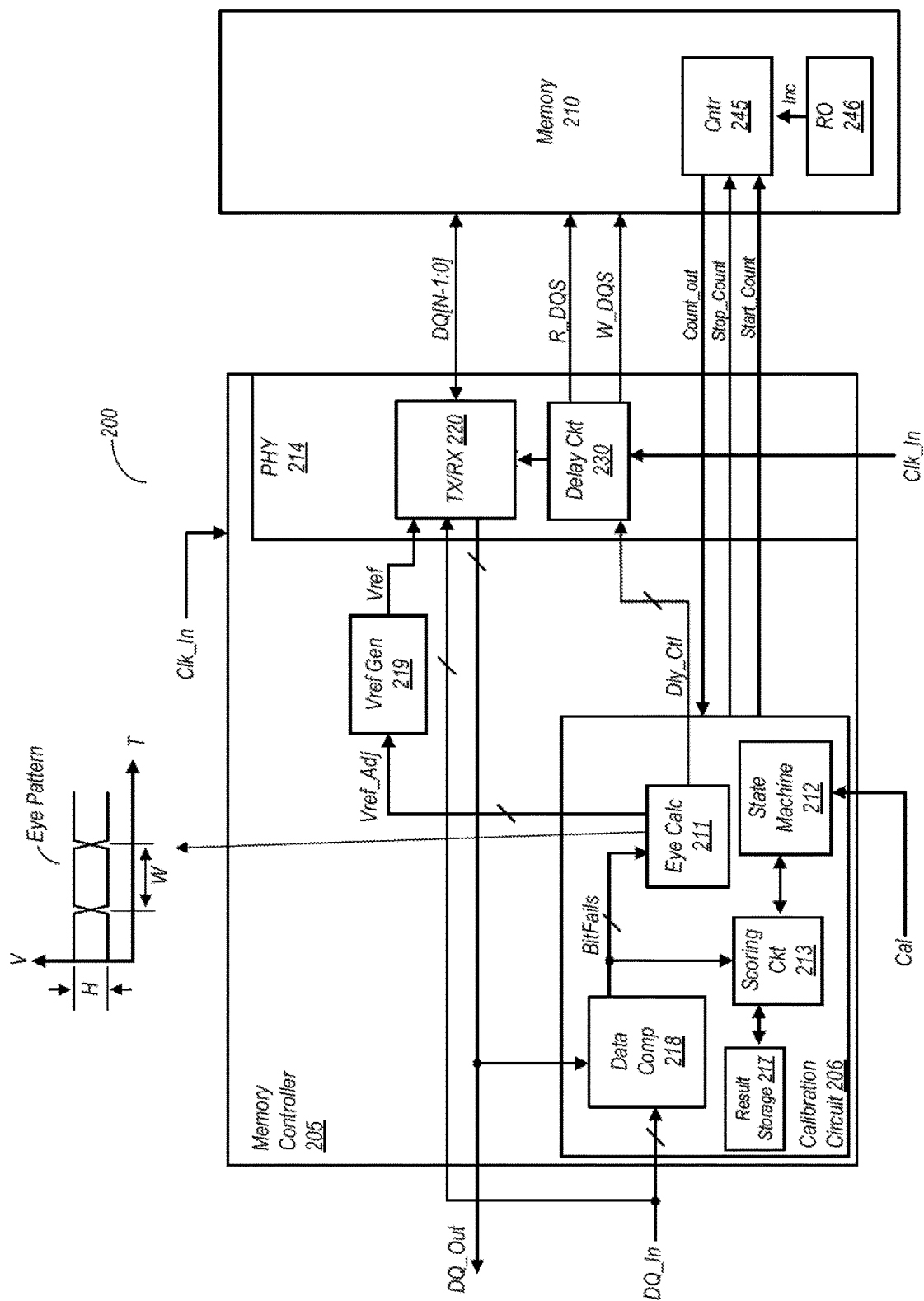
FIG. 2 is a block diagram of another embodiment of a memory subsystem.

FIG. 2 is a block diagram of another embodiment of a memory subsystem. In the embodiment shown, memory controller 205 includes a calibration control circuit 206 and a physical interface 214. Calibration circuit 206 in the embodiment shown implements various circuit units, including data comparator 218, eye calculator 211, a state machine 212, a scoring circuit 213, and a results storage circuit 217. Physical interface 214 implements circuitry for communicating with a memory (not shown here). The circuitry of physical interface 214 includes transceiver 220 and a delay circuit 230. Data to be written to memory may be received by memory controller via the DQ_In signal path. Data read from memory may be conveyed to a requestor via the DQ_Out data bus.

In the embodiment shown, transceiver 220 of physical interface 214 is coupled to a data bus which includes data signal paths DQ[N−1:0]. Additionally, physical interface 214 includes a delay circuit 230 from which a read data strobe signal, R_DQS, and a write data strobe signal, W_DQS, are generated (based on the variable frequency clock signal, Clk_In) and conveyed to the memory in order to synchronize transfers of data. The read data strobe signal may be used to synchronize data transfers during read operations, while the write data strobe may be used to synchronize data transfers during write operations. Embodiments are also possible and contemplated in which a single data strobe signal is provided for both read and write operations.

Physical interface 214 may also include circuitry (not shown here) for adjusting various I/O settings associated with the transmission of signals to and reception of signals from memory. This may include circuitry for adjusting the drive strength of signals, controlling the impedances and/or termination of signal lines, and so on.

It is noted that in various embodiments, additional signal paths may be coupled to physical interface 214. These signal paths may include paths to convey write enable signals, read enable signals, address signals, and so on, from memory controller 205 to a correspondingly coupled memory. Similarly, physical interface 214 may include circuitry for generating these signals, and may include additional circuits for receiving signals. These additional signal paths and circuits are omitted here for the sake of simplicity, although their absence in the drawing is not intended to limit the disclosure in any way.

During read operations, transceiver 220 may receive signals conveyed from the memory via the signal paths DQ[N−1:0]. Transceiver 220 may also interpret the received signals using a reference voltage value (e.g., generated by a reference voltage generator circuit, not shown here). The reference voltage may be set by eye calculator 211, via the ReadV signal path. Using the reference voltage, transceiver 220 may determine whether individual ones of the received data signals are to be interpreted as a logic 0 or a logic 1. During normal operations, the output of transceiver 220, when operating to receive data from memory, is the DQ_Out signal path, with the data being conveyed to other units (e.g., to a requesting agent such as a processor core).

Delay circuit 230 in the embodiment shown is coupled to receive an input clock signal, Clk_In, provided from a source external to memory controller 205. Although not explicitly shown, delay circuit 230 may include one or more delay locked loops (DLLs) or other type of delay circuitry. Delay may be applied to the input clock signal to generate the data strobe signals, R_DQS and W_DQS, which are used to synchronize the transfer of other signals (e.g., DQ[N−1:0]) between memory 210 and memory controller 205 during read and write operations, respectively. The amount of delay applied may be based on a delay control signal, Dly_Ctl, provided by eye calculator 211 in calibration control circuit 206. Separate instances of a delay control signal may be provided for the read and write data strobe signals. In addition to conveying the data strobe signals to the memory 210, delay circuit 230 in the embodiment shown is also coupled to provide a clock signal to transceiver 220.

Calibration operations may include varying the reference voltage and an amount of delay applied to a particular one of the data strobe signals. Calibration operations may be carried out for both the read data strobe, R_DQS, as well as for the write data strobe, W_DQS. Furthermore, both of these data strobe signals may undergo both horizontal and vertical calibrations. Horizontal calibrations may include varying the delay over a number of different values at a particular reference voltage. A vertical calibration may include performing a number of horizontal calibrations at different reference voltage values. At each combination of a delay and a reference voltage, data may be read from memory and compared to expected values by data comparator 218 in order to determine if any bit fails occur. A bit fail may be defined herein as a bit corresponding to a signal conveyed on a particular signal path of the data bus not matching its expected value (e.g., the bit is read as a logic 0 when a logic 1 is expected). In some embodiments, the data that is compared may be received by data comparator 218 via the DQ_In input, and thus the corresponding calibration operations may include the writing of this data to memory.

Bit fails may be reported to eye calculator circuit 211. Responsive to receiving information of a bit fail, eye calculation circuit 211 may record the failing bit along with the reference voltage value and the delay value. Based on the data from failing bits and corresponding reference voltage and delay values, eye calculation circuit 211 may calculate an eye pattern. In some embodiments, an eye pattern may be calculated for each bit position individually, with the eye being calculated based on, e.g., an average of the individual signal paths.

Figure 3:
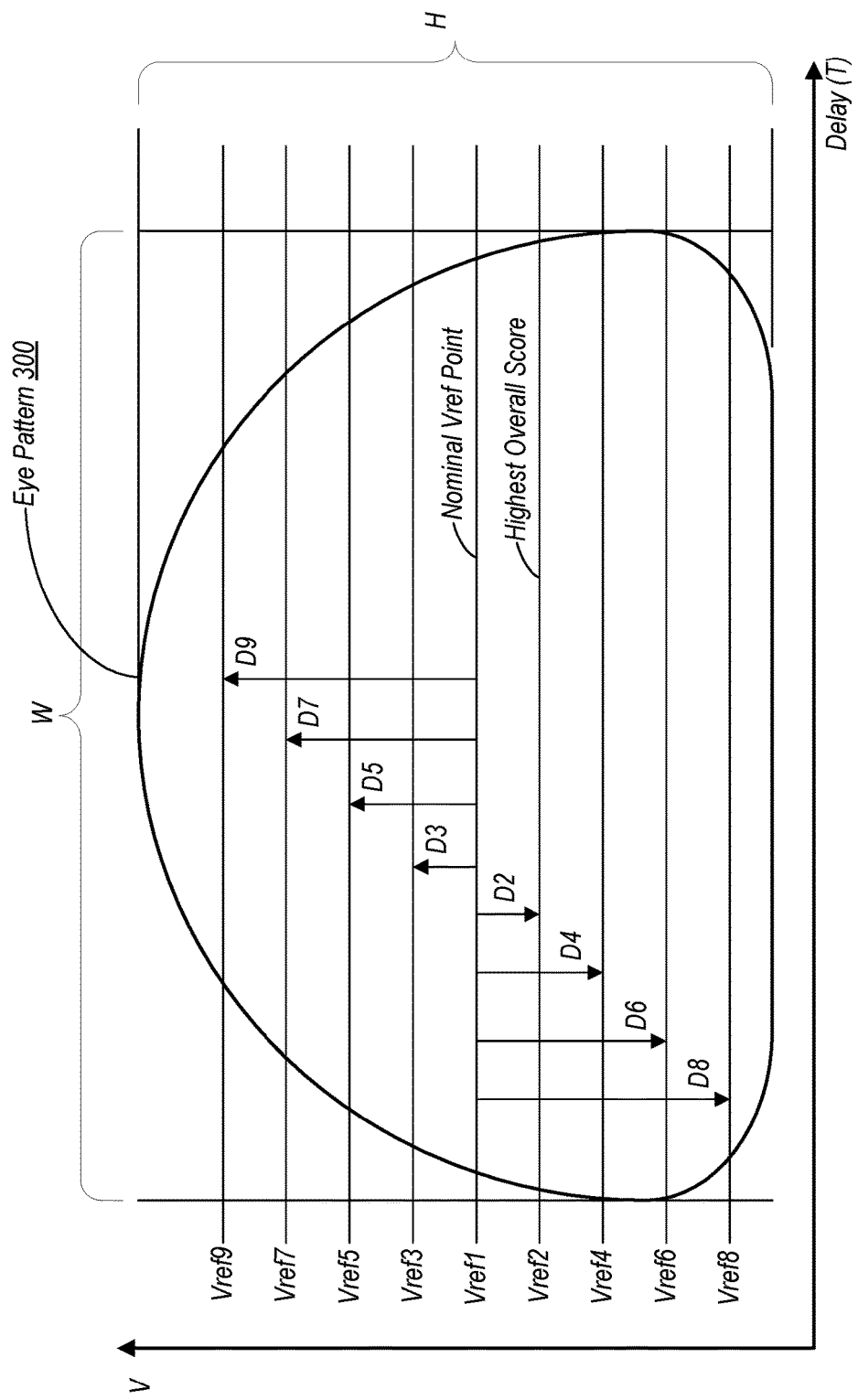
FIG. 3 is a diagram of an eye diagram illustrating one embodiment of a calibration methodology.

Some calibration operations may include a number of writes of data to memory in addition to a number of reads of data from memory. Over a number of iterations, eye calculator 211 may cause adjustments to both the delay used in generation of the data strobe signal (via the Dly_Ctl signal) and the reference voltage used to distinguish between a logic 1 and a logic 0. Performing these operations for a number of different delay and reference voltage values may be used to define the eye pattern for the calibrated signal paths. An example eye pattern is shown in FIG. 3, with its height H along the vertical, voltage axis V, while the width W is defined along the time axis T. The voltage axis represents values of the reference voltage, while the time axis represents delay values applied to the data strobe signal by delay circuit 230. Values within the boundaries indicated in the drawing, defined in part by the height and width of the eye pattern, indicate areas where data bits conveyed in a signal can be correctly interpreted as a logic 1 or a logic 0. The areas toward the center of the eye pattern in this particular example generally have a larger amount of timing margin and voltage margin than those located toward the boundaries. However, the eye patterns may at times have an irregular shape, and thus calibration circuit 206 is configured to carry out a calibration that includes a scoring methodology to account for an irregular shape.

Scoring circuit 213 in the embodiment shown is configured to generate scores during the calibrations. In one embodiment, scoring circuit 213 may apply an initial score to each horizontal calibration that is performed as part of a vertical calibration. The score may correspond to the range of delay values at which valid data is returned from memory 210, with higher scores being assigned for larger delay value ranges. Since the vertical calibration comprises a number of horizontal calibrations at different reference voltages, corresponding horizontal calibration scores are generated for these different reference voltages.

Scoring circuit 213 may then adjust each of these scores by applying a penalty factor. The penalty factor comprises an adjustment to a score in which some amount is subtracted therefrom based on the distance of the reference voltage at which the horizontal calibration was conducted and a nominal reference voltage. In one embodiment, the nominal reference voltage may be a voltage that is between a lowest possible and a highest possible voltage at which valid data can be read. This voltage may change during the operation of memory controller 205 (e.g., due to temperature variations) and may thus be updated accordingly based on calibration results. Embodiments in which the nominal voltage is a static value are also possible and contemplated.

The penalty scores increase as the distance from the nominal voltage increases. Thus, scores generated for horizontal calibrations that are farther away from the nominal reference voltage are penalized (reduced) more than those that are closer to the nominal reference voltage. The penalty factor may be calculated as being proportional (or linearly) related to the distance from the nominal voltage, or a value that is exponentially related to that distance. By increasing the penalty applied to a horizontal score based on the distance from the reference voltage may prevent the selection of an operating reference voltage that does not have sufficient voltage margin.

State machine 212 in the embodiment shown is configured to coordinate the calibration operations. Responsive to receiving a calibration signal (Cal) from either within another portion of memory controller 205 or from an external source, state machine 212 may commence calibration operations. Assertion of the calibration signal may be performed in conjunction with a system startup, upon an exit from a sleep state, at periodic intervals, and in response to changes in a performance state, among other conditions. During calibration operations, state machine 212 may communicate with eye calculator 211, scoring circuit 213, data comparator 218, and transceiver 220. Among the functions that state machine 212 may perform include issuing commands to transmit data for write operations, to cause memory controller 205 to read data from memory 210, and to cause a change to the delay and read voltage values. Upon completing a given calibration, eye calculator 211 may store the determined reference voltage and delay values. These values may then be used to set the reference voltage and delay values for normal (e.g., non-calibration) operations.

In the embodiment shown, memory 210 includes a ring oscillator 246 and a counter 245 coupled thereto. Calibration circuit 206 in various embodiments may carry out a background calibration that can be performed concurrently with, or in parallel with the reference voltage calibration discussed above. This may be used to determine a scaling factor that can be applied to adjust the delay between the data bus and the write data strobe signal W_DQS, when a frequency change occurs (e.g., due to a performance state change) the input clock signal, Clk_In, but can also be used in lieu of periodic calibrations. The background calibration may begin with a command, Start_Count, being sent to counter 245. In response to the Start_Count command, counter 245 begins incrementing the counter based on the periodic output signal, Inc, from ring oscillator 246. After allowing for the incrementing the counter for some specified amount of time, calibration circuit 206 sends a second command, Stop_Count, to counter 245. In response to receiving the second command, counter 245 discontinues incrementing and sends the accumulated count value, Count_out, back to calibration circuit 206. In an alternative embodiment, a register may be used to indicate a number of cycles ring oscillator 246 is to increment counter 245 and to stop automatically when the indicated number is reached. The scaling factor may be determined based on an amount of time required to reach the indicated number of cycles.

Using the incremented count value, calibration circuit 206 may apply a scaling factor to adjust a delay between signals on the data bus and the write data strobe, W_DQS, in response to a frequency change to the input clock signal, Clk_In, or in lieu of performing a periodic calibration. However, if the count value is not within a particular range, calibration circuit 206 may instead conduct a calibration of the write data strobe. For example, if the count value after the frequency change is less than 10%, the write calibration may be skipped. On the other hand, if the count value has changed more than 10%, the write calibration may be performed, as the change in count value indicates that a greater than desirable error is introduced by the clock frequency change. In some cases, if the count value has changed by an ever greater amount (e.g., 20% or more), a full scan calibration may be performed. The full scan calibration may comprise scanning over a range of values to find the passing points of the eye, whereas the write calibration performed for deviations between, e.g., 10-20% may be binary calibrations that begin at the center point of the previous eye.

Eye Diagram Illustration of Calibration Methodology:

FIG. 3 is a of an eye diagram illustrating one embodiment of a calibration methodology. In the example shown, eye pattern is an irregularly shaped eye pattern having a width W along a horizontal axis representing a delay time T, and a height H along a vertical access representing a reference voltage V. The diagram also illustrates a number of example reference voltage values at which horizontal calibrations have been conducted to determine the shape of the eye pattern. As can be seen, the eye pattern is wider towards the bottom, rather than in the middle as is a typical diamond-shaped eye pattern. In this example, the eye pattern is widest at Vref6, and narrowest at Vref9. A nominal reference voltage, Vref1, is situated at the approximate halfway point between the bottom and top of eye pattern 300.

While Vref6 in the illustrated example shown would have the highest initial score, based on the widest range of values, it has a very small amount of voltage margin on the low side. A penalty factor D6 is applied to reduce the score at Vref6. This penalty factor is greater than, e.g., the penalty factor D4 used to reduce the score at Vref4, and penalty factor D2 used to reduce the score at Vref2. In this particular example, Vref2 has the highest overall score and may thus be selected as the operating reference voltage for normal memory options following the calibration (where normal memory operations are defined as memory operations performed as the system carries out its intended function). Although Vref4 and Vref6 have a larger range of delay values (and thus higher initial scores) the reduction due to the penalty factor reduces their overall score to a value less than that of Vref2. These lower overall scores reflect the fact that there is less voltage margin at Vref4 and Vref6, while the timing margin at Vref2 is not significantly less than the former two.

Calculating of the overall score may be carried out, in one embodiment, using a scaling factor that is proportional to the distance between the nominal reference voltage and the reference voltage used to generate the initial score via a horizontal calibration:

$$\text{Vref\_Score} = \text{Initial Score} - (\text{Distance} * \text{Scale\_Lin}) \quad \text{(Eq. 1)}$$

where Vref_Score is the overall score, Initial Score is based on the eye width at that particular reference voltage, Distance is the difference between the nominal reference voltage and the particular reference voltage, and Scale_Lin is a scaling factor that, when multiplied by the distance, results in a penalty factor that is proportional to the distance that is then subtracted from the initial score.

In another embodiment, calculating of the overall score may be carried out using a penalty factor having a term that is a square of the distance:

$$\text{Vref\_Score} = \text{Initial Score} - (\text{Distance}^2 * \text{Scale\_Exp}) \qquad \text{(Eq. 2)}.$$

In this equation, a square (and more generally, and exponential) of the distance is multiplied by a scaling factor, Scale_Exp, to arrive at the penalty factor subtracted from the initial score. Embodiments in which the overall score is determined based on penalty factors that include both the proportional (linear) term and the exponential term are also possible and contemplated, as are other ways of arriving at an overall score. Thus, the disclosure generally contemplates a formula using any suitable terms for determining a penalty factor and thus an overall score by which to determine a suitable operating reference voltage.

Method Embodiments

Figure 4:
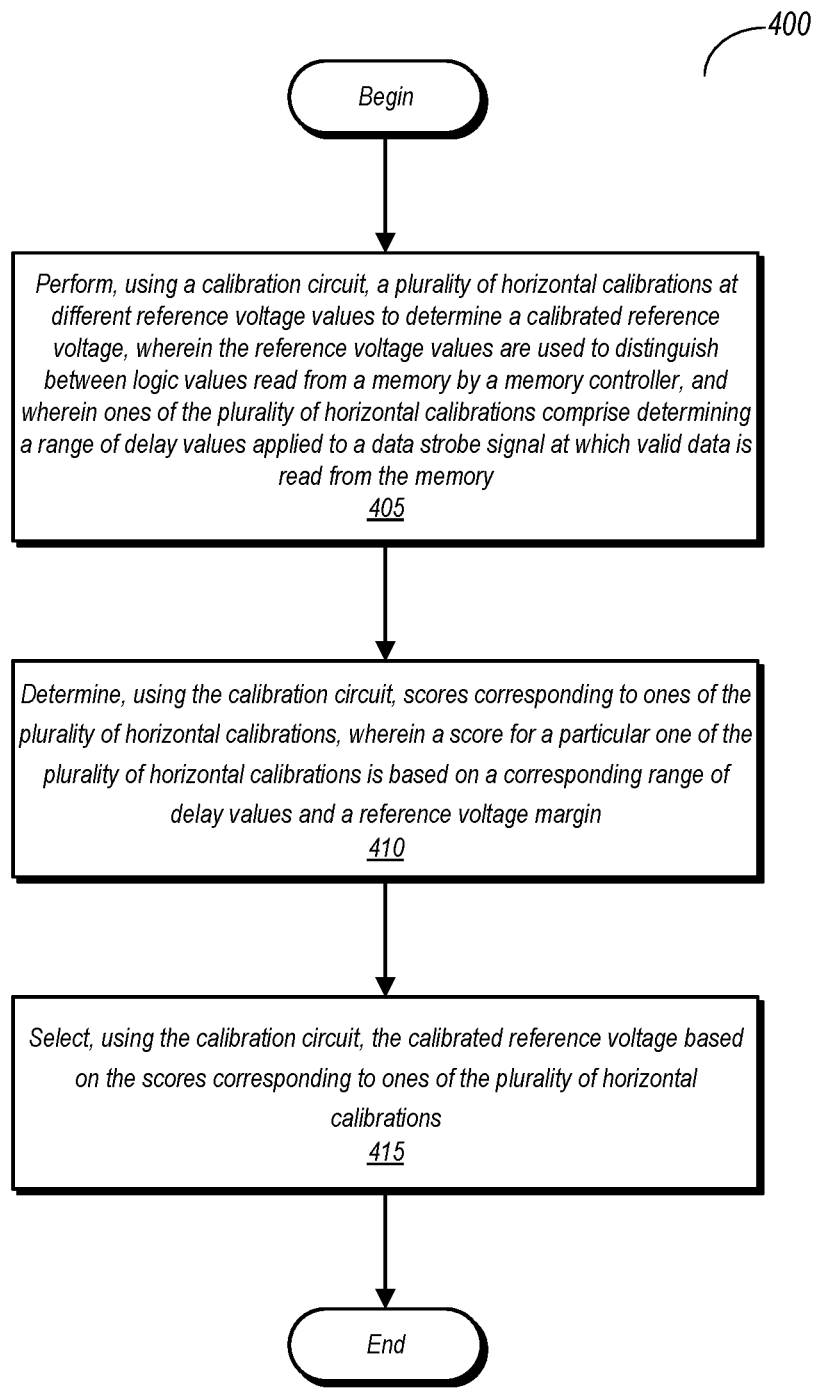
FIG. 4 is a flow diagram of one embodiment of a method for performing a calibration in a memory subsystem.

FIG. 4 is a block diagram of one embodiment of a method for performing a reference voltage calibration. Method 400 may be carried out in various embodiments of a memory subsystem such as those discussed above. Embodiments of a memory subsystem in which Method 400 may be carried out are also considered to fall within the scope of this disclosure.

Method 400 begins with performing, using a calibration circuit, a plurality of horizontal calibrations at different reference voltage values to determine a calibrated reference voltage, wherein the reference voltage values are used to distinguish between logic values read from a memory by a memory controller, and wherein ones of the plurality of horizontal calibrations comprise determining a range of delay values applied to a data strobe signal at which valid data is read from the memory (block 405). The method further includes determining, using the calibration circuit, scores corresponding to ones of the plurality of horizontal calibrations, wherein a score for a particular one of the plurality of horizontal calibrations is based on a corresponding range of delay values and a reference voltage margin (block 410). Thereafter, the method includes selecting, using the calibration circuit, the calibrated reference voltage based on the scores corresponding to ones of the plurality of horizontal calibrations (block 415).

In various embodiments, the method includes determining, by the calibration circuit, a preliminary score that is based on the range of delay values such that a greater range of delay values corresponds to a greater score. Such embodiments may also include determining, by the calibration circuit, a penalty score that is based on a difference between a particular reference voltage value at which the horizontal calibration was conducted and a nominal reference voltage value. In such embodiments, a score for the particular reference voltage value is calculated by subtracting the penalty score from the preliminary score. The penalty score in these embodiments is based on a value that is proportional to the difference between a particular reference voltage value at which the horizontal calibration was conducted and the nominal reference voltage value. Accordingly, such embodiments of the method include updating, by the calibration circuit, the nominal reference voltage based on the calibrated reference voltage.

In some embodiments, the method includes selecting, using the calibration circuit, the calibrated reference voltage value based on a particular reference voltage value for which a corresponding horizontal calibration yielded a highest score. Various embodiments of the method also include, concurrent with performing the reference voltage calibration, initiating, by the calibration circuit a background calibration by sending a first command to the memory. Performing the background calibration comprises a ring oscillator implemented on the memory incrementing a counter in response to the first command. Thereafter, the method includes sending, by the calibration circuit, a second command to the memory to complete the background calibration, wherein the memory is configured to convey a count value to the calibration circuit in response to receiving the second command. Thereafter, the method includes adjusting, by the calibration circuit, a clock signal conveyed between the memory controller and the memory based on the count value.

Figure 5:
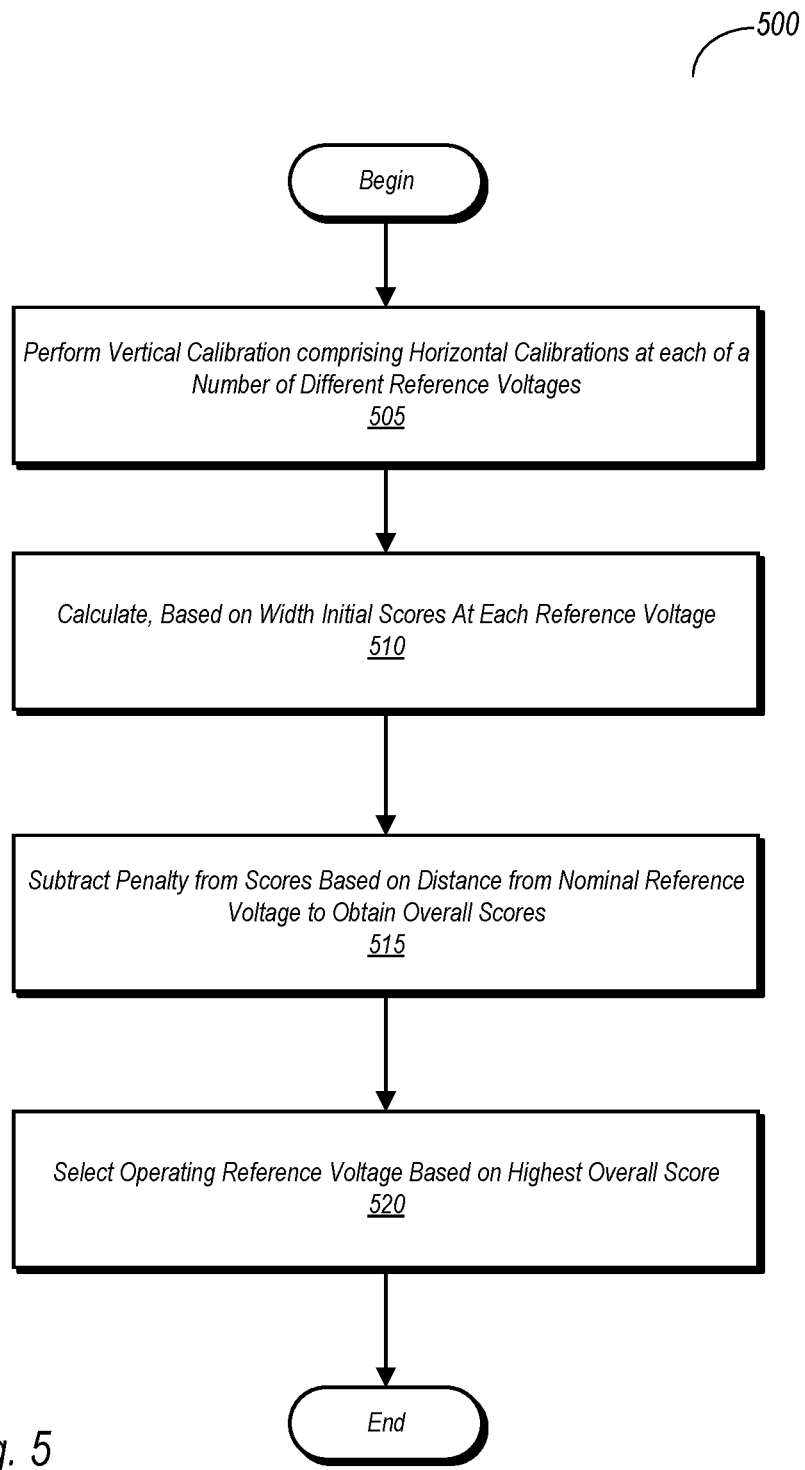
FIG. 5 is a flow diagram of one embodiment of a method for performing a calibration in a memory subsystem.

FIG. 5 is a flow diagram of another embodiment of a method for performing a reference voltage calibration. Method 500 may be carried out in various embodiments of a memory subsystem such as those discussed above. Embodiments of a memory subsystem in which Method 500 may be carried out are also considered to fall within the scope of this disclosure.

Method 500 includes performing a vertical calibration, wherein the vertical calibration comprises performing horizontal calibrations at each of a number of different reference voltages (block 505). A horizontal calibration comprises performing data transfers between the memory and the memory subsystem, with the data transfers being synchronized by a data strobe signal. During the calibrations, multiple reads of data from memory are conducted, with a different amount of delay applied to the data strobe signal for each read of data. The data returned to the memory controller is checked against expected data to determine whether the results for that particular iteration are passing or failing. From this, a range of delay values, as applied to the data strobe, is determined over which passing data (e.g., returned data=expected data) is returned to the memory controller. This is carried out at a number of different reference voltage values. A two-dimensional graph of the vertical and horizontal ranges of passing values forms an eye pattern.

After completing the performance of each of the horizontal calibrations, initial scores are determined based on the width of the eye at each reference voltage (block 510). The width of the eye corresponds to a range of delay values for which passing data was returned from the memory. In one embodiment, the initial scores increase as the width increases, and thus the reference voltage with the highest initial score will be that one with the greatest range. The reference voltage with the greatest range is thus the one at which the greatest timing margin is available.

After determining the initial scores, penalty scores are subtracted from each based on a distance from a nominal reference voltage (block 515). In this manner, overall scores are determined for each reference voltage. The penalty score applied to a particular reference voltage is based on a distance between the particular reference voltage and a nominal voltage. In one embodiment, the nominal voltage may be that voltage with the greatest voltage margin. The penalty scores may be determined using a linear (or proportional) function in one embodiment, wherein the penalty scores are thus proportional to the distance of the particular reference voltage to the nominal voltage. In another embodiment, an exponential function may be used, with the penalty scores increasing exponentially with the distance from the nominal voltage.

After calculating the overall score for each reference voltage, an operating reference voltage value is selected based on the highest one (block 520). In instances where an eye pattern has an irregular shape, this reference voltage may not necessarily correspond to a reference voltage that has the largest possible voltage margin or the largest possible timing margin. Nevertheless, the methodology described herein may ensure that the operating reference voltage value is selected based on a reference voltage with an sufficient amount of voltage and timing margin such that data may be consistently read from memory without error induced by an incorrect interpretation of its value.

Figure 6:
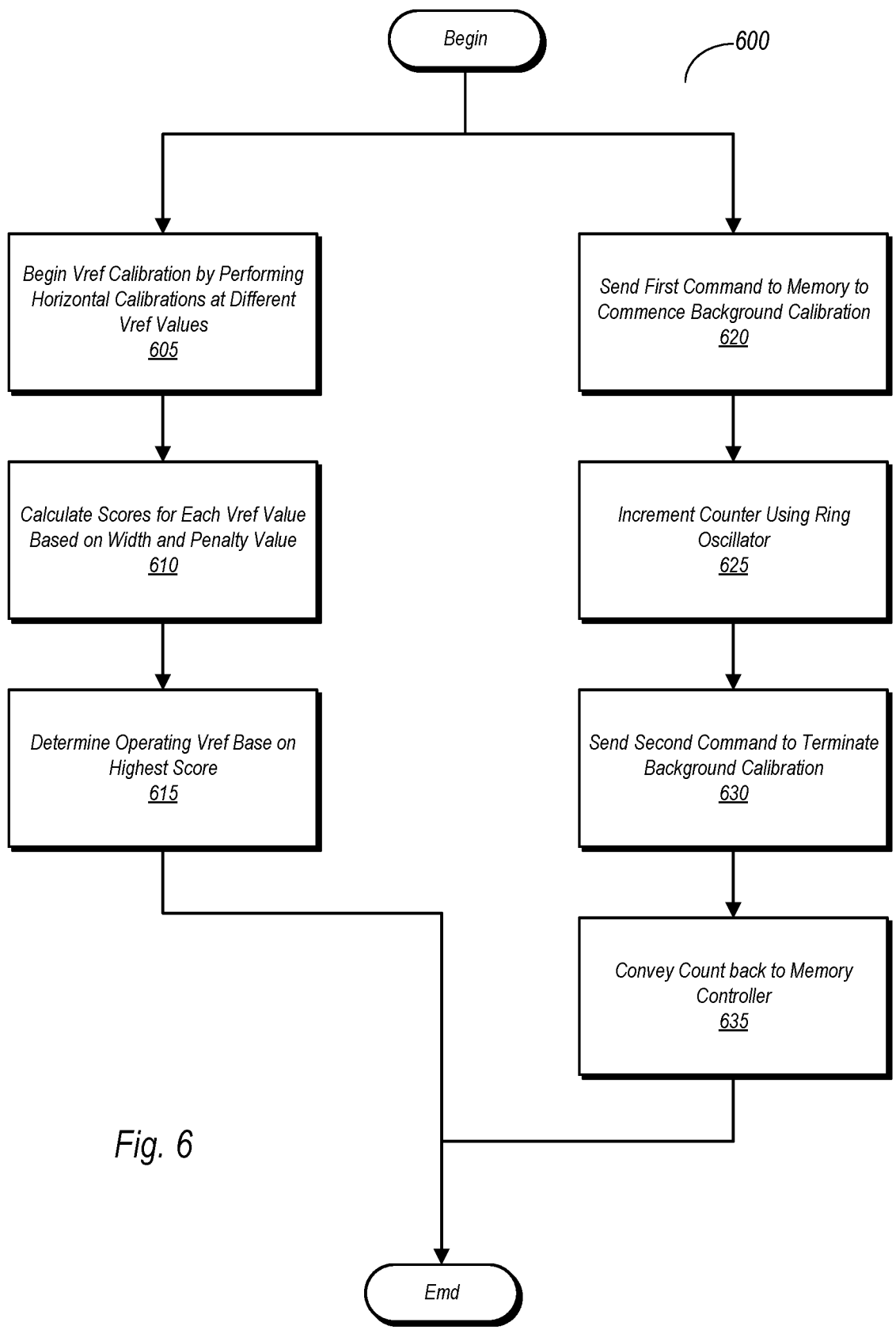
FIG. 6 is a flow diagram of one embodiment of a method for performing calibrations in parallel in a memory subsystem.

FIG. 6 is a flow diagram of another embodiment of a method for performing calibrations in a memory subsystem. Method 600 may be carried out in various embodiments of a memory subsystem such as those discussed above. Embodiments of a memory subsystem in which Method 600 may be carried out are also considered to fall within the scope of this disclosure.

Method 600 in the embodiment shown comprises performing two parallel operations. A first operation begins with the performing of a reference voltage calibration that includes performing horizontal calibrations at a number of different reference voltage values (block 605). The method further comprises calculating scores for each of the reference voltage values, wherein the scores are based on a width of the eye at a particular reference voltage and the distance of that reference voltage from a nominal reference voltage (block 610). The scoring methodology comprises increasing the scores at the width of the eye increases, as well as decreasing the scores (by applying a penalty value) based on the distance of a particular reference voltage from a nominal reference voltage. Generally speaking, scores are reduced by a greater amount for reference voltages that are farther from the nominal reference voltage relative to those reference voltages values that are closer thereto. Based on which reference voltage has the highest overall score, an operating reference voltage value is selected (block 615).

The second operation comprises performing a background calibration that is performed in parallel (or concurrently) with the reference voltage calibration described above. In the background calibration, a first command is sent from the memory to commence the background calibration (block 620). The memory includes both a ring oscillator and a counter implemented thereon. In response to receiving the command, the ring oscillator may begin incrementing the counter (block 625). The counter may be incremented for a certain time, after which the memory controller sends a second command to terminate the background calibration (block 630). As noted above, in an alternate embodiment, the counter may increment for a preset amount of time and stop automatically once that time has elapsed. Thereafter, the count value is conveyed from the memory controller back to the memory (block 635).

Using the count value, the memory controller may apply a scaling factor to a write data strobe signal. This scaling factor may be applied when the memory subsystem undergoes a performance state change in which there is a change of frequency to an external clock signal provided to the memory controller. Additionally, the count value may be compared to a particular range of values. If the count value is within this range of values, a full write calibration may be skipped, thereby saving a significant amount of time as well as an amount of power that would otherwise be consumed.

Example System

Figure 7:
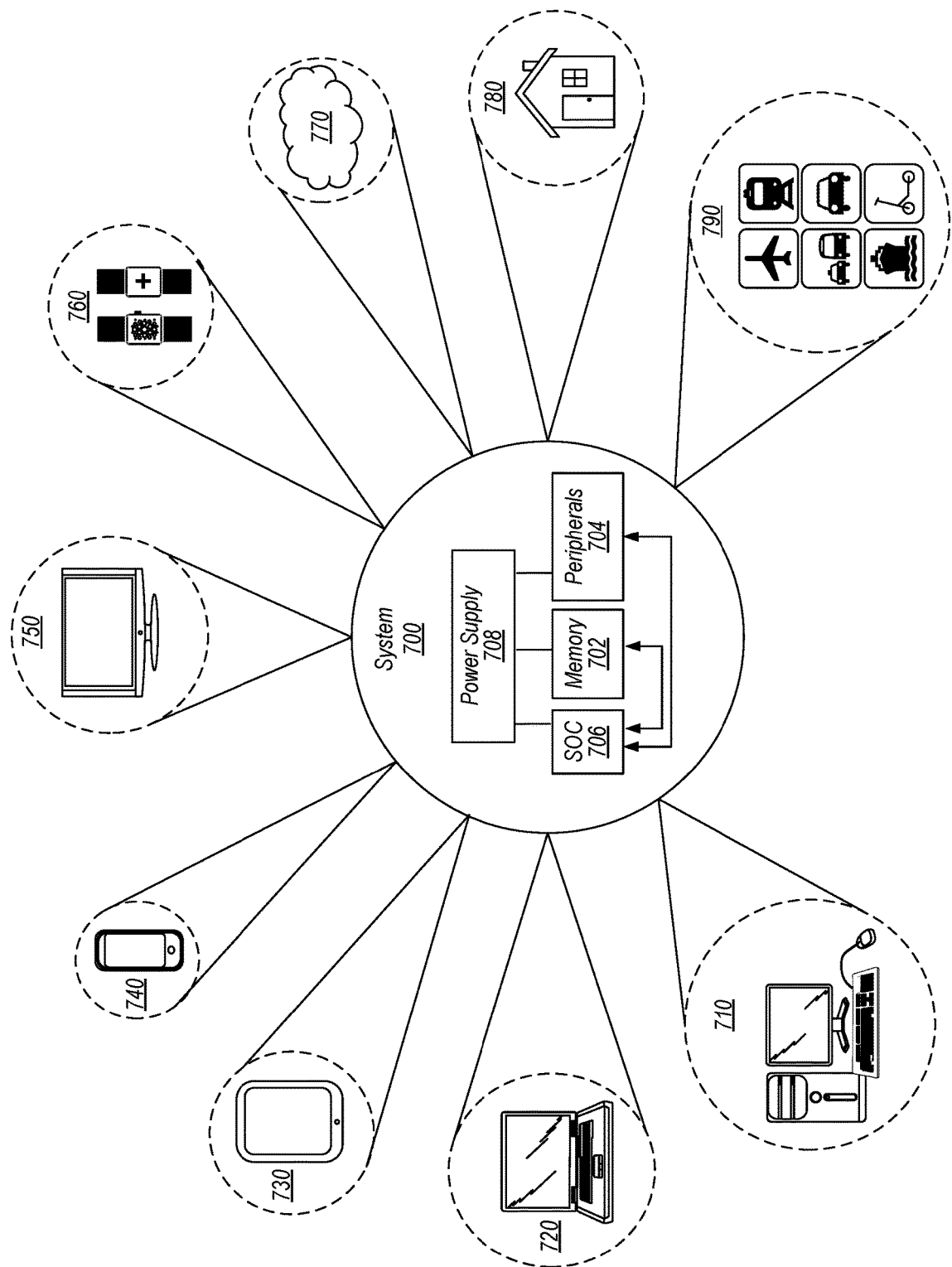
FIG. 7 is a diagram of one embodiment of an example system.

Turning next to FIG. 7, a block diagram of one embodiment of a system 700 is shown that may incorporate and/or otherwise utilize the methods and mechanisms described herein. In the illustrated embodiment, the system 700 includes at least one instance of a system on chip (SoC) 706 which may include multiple types of processing units, such as a central processing unit (CPU), a graphics processing unit (GPU), or otherwise, a communication fabric, and interfaces to memories and input/output devices. In some embodiments, one or more processors in SoC 706 includes multiple execution lanes and an instruction issue queue. In various embodiments, SoC 706 is coupled to external memory 702, peripherals 704, and power supply 708.

A power supply 708 is also provided which supplies the supply voltages to SoC 706 as well as one or more supply voltages to the memory 702 and/or the peripherals 704. In various embodiments, power supply 708 represents a battery (e.g., a rechargeable battery in a smart phone, laptop or tablet computer, or other device). In some embodiments, more than one instance of SoC 706 is included (and more than one external memory 702 is included as well).

The memory 702 is any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. One or more memory devices are coupled onto a circuit board to form memory modules such as single inline memory modules (SIMMs), dual inline memory modules (DIMMs), etc. Alternatively, the devices are mounted with a SoC or an integrated circuit in a chip-on-chip configuration, a package-on-package configuration, or a multi-chip module configuration.

SoC 706 in the embodiment shown may include one or more instances of a memory controller such as the embodiments described above. At least one memory controller may form a memory subsystem with memory 702. Similarly, other instances of a memory may be implemented either on SoC 706 or elsewhere in system 700, with corresponding instances of a memory controller. The various instances of a memory controller may include calibration circuitry arranged to perform memory calibrations in accordance with the various method embodiments discussed above.

The peripherals 704 include any desired circuitry, depending on the type of system 700. For example, in one embodiment, peripherals 704 includes devices for various types of wireless communication, such as Wi-Fi, Bluetooth, cellular, global positioning system, etc. In some embodiments, the peripherals 704 also include additional storage, including RAM storage, solid state storage, or disk storage. The peripherals 704 include user interface devices such as a display screen, including touch display screens or multi-touch display screens, keyboard or other input devices, microphones, speakers, etc.

As illustrated, system 700 is shown to have application in a wide range of areas. For example, system 700 may be utilized as part of the chips, circuitry, components, etc., of a desktop computer 710, laptop computer 720, tablet computer 730, cellular or mobile phone 740, or television 750 (or set-top box coupled to a television). Also illustrated is a smartwatch and health monitoring device 760. In some embodiments, smartwatch 760 may include a variety of general-purpose computing related functions. For example, smartwatch 760 may provide access to email, cellphone service, a user calendar, and so on. In various embodiments, a health monitoring device may be a dedicated medical device or otherwise include dedicated health related functionality. For example, a health monitoring device may monitor a user's vital signs, track proximity of a user to other users for the purpose of epidemiological social distancing, contact tracing, provide communication to an emergency service in the event of a health crisis, and so on. In various embodiments, the above-mentioned smartwatch may or may not include some or any health monitoring related functions. Other wearable devices are contemplated as well, such as devices worn around the neck, devices that are implantable in the human body, glasses designed to provide an augmented and/or virtual reality experience, and so on.

System 700 may further be used as part of a cloud-based service(s) 770. For example, the previously mentioned devices, and/or other devices, may access computing resources in the cloud (i.e., remotely located hardware and/or software resources). Still further, system 700 may be utilized in one or more devices of a home other than those previously mentioned. For example, appliances within the home may monitor and detect conditions that warrant attention. For example, various devices within the home (e.g., a refrigerator, a cooling system, etc.) may monitor the status of the device and provide an alert to the homeowner (or, for example, a repair facility) should a particular event be detected. Alternatively, a thermostat may monitor the temperature in the home and may automate adjustments to a heating/cooling system based on a history of responses to various conditions by the homeowner. Also illustrated in FIG. 7 is the application of system 700 to various modes of transportation. For example, system 700 may be used in the control and/or entertainment systems of aircraft, trains, buses, cars for hire, private automobiles, waterborne vessels from private boats to cruise liners, scooters (for rent or owned), and so on. In various cases, system 700 may be used to provide automated guidance (e.g., self-driving vehicles), general systems control, and otherwise. These any many other embodiments are possible and are contemplated. It is noted that the devices and applications illustrated in FIG. 7 are illustrative only and are not intended to be limiting. Other devices are possible and are contemplated.

The present disclosure includes references to "an "embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent claims that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third" when applied to a feature do not imply any type of ordering (e.g., spatial, temporal, logical, etc.), unless stated otherwise.

The phrase "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation [entity] configured to [perform one or more tasks]—is used herein to refer to structure (i.e., something physical). More specifically, this formulation is used to indicate that this structure is arranged to perform the one or more tasks during operation. A structure can be said to be "configured to" perform some tasks even if the structure is not currently being operated. Thus, an entity described or recited as being "configured to" perform some tasks refers to something physical, such as a device, circuit, a system having a processor unit and a memory storing program instructions executable to implement the task, etc. This phrase is not used herein to refer to something intangible.

In some cases, various units/circuits/components may be described herein as performing a set of tasks or operations. It is understood that those entities are "configured to" perform those tasks/operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112(f) for that claim element. Should Applicant wish to invoke Section 112(f) during prosecution of a United States patent application based on this disclosure, it will recite claim elements using the "means for" [performing a function] construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory (e.g., random-access memory, embedded dynamic random-access memory, programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), functional unit, memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements may be defined by the functions or operations that they are configured to implement. The arrangement and such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used to transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and other circuit elements (e.g. passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

Numerous variations and modifications will become apparent to those skilled in the art once the above disclosure is fully appreciated. It is intended that the following claims be interpreted to embrace all such variations and modifications.

What is claimed is:

1. An apparatus comprising:
   a memory; and
   a memory controller coupled to the memory, wherein the memory controller includes a calibration circuit configured to:
      perform a reference voltage calibration to determine a reference voltage used to distinguish between logic values read from the memory, wherein the reference voltage calibration comprises performing a plurality of horizontal calibrations at different reference voltage values, and wherein ones of the horizontal calibrations comprise determining a range of delay values applied to a data strobe signal at which valid data is read from the memory;
      determine scores corresponding to ones of the plurality of horizontal calibrations, wherein a score for a particular one of the plurality of horizontal calibrations is based on a corresponding range of delay values and a reference voltage margin; and
      select a calibrated reference voltage based on the scores corresponding to ones of the plurality of horizontal calibrations.

2. The apparatus of claim 1, wherein, to determine a score for a particular horizontal calibration of the plurality of horizontal calibrations, the calibration circuit is configured to:
   determine a preliminary score that is based on the range of delay values such that a greater range of delay values corresponds to a greater score; and
   determine a penalty score that is based on a difference between a particular reference voltage value at which the horizontal calibration was conducted and a nominal reference voltage value;
   wherein a score for the particular reference voltage value is calculated by subtracting the penalty score from the preliminary score.

3. The apparatus of claim 2, wherein the penalty score is based on a value that is proportional to the difference between a particular reference voltage value at which the horizontal calibration was conducted and the nominal reference voltage value.

4. The apparatus of claim 2, wherein the penalty score is based on an exponential value corresponding to the difference between a particular reference voltage value at which the horizontal calibration was conducted and the nominal reference voltage value.

5. The apparatus of claim 2 wherein the calibration circuit is configured to update the nominal reference voltage based on the calibrated reference voltage.

6. The apparatus of claim 2, wherein the nominal reference voltage value is a static value.

7. The apparatus of claim 1, wherein the calibration circuit is configured to select the calibrated reference voltage based on a particular reference voltage value for which a corresponding horizontal calibration yielded a highest score.

8. The apparatus of claim 1, wherein the calibration circuit is further configured to, concurrent with performing the reference voltage calibration, initiate a background calibration by sending a first command to the memory.

9. The apparatus of claim 8, wherein the memory includes a ring oscillator and a counters, and wherein performing the background calibration comprises the ring oscillator incrementing the counter in response to receiving the first command.

10. The apparatus of claim 9, wherein the calibration circuit is further configured to:
send a second command to the memory to complete the background calibration, wherein the memory is configured to convey a count value to the calibration circuit in response to receiving the second command; and
adjust a write clock signal conveyed between the memory controller and the memory based on the count value.

11. A method comprising:
performing, using a calibration circuit, a plurality of horizontal calibrations at different reference voltage values to determine a calibrated reference voltage, wherein the reference voltage values are used to distinguish between logic values read from a memory by a memory controller, and wherein ones of the plurality of horizontal calibrations comprise determining a range of delay values applied to a data strobe signal at which valid data is read from the memory;
determining, using the calibration circuit, scores corresponding to ones of the plurality of horizontal calibrations, wherein a score for a particular one of the plurality of horizontal calibrations is based on a corresponding range of delay values and a reference voltage margin; and
selecting, using the calibration circuit, the calibrated reference voltage based on the scores corresponding to ones of the plurality of horizontal calibrations.

12. The method of claim 11, wherein the method further comprises:
determining, by the calibration circuit for a particular horizontal calibration of the plurality of horizontal calibrations, a preliminary score that is based on the range of delay values such that a greater range of delay values corresponds to a greater score; and
determining, by the calibration circuit, a penalty score that is based on a difference between a particular reference voltage value at which the horizontal calibration was conducted and a nominal reference voltage value;
wherein a score for the particular reference voltage value is calculated by subtracting the penalty score from the preliminary score.

13. The method of claim 12, wherein the penalty score is based on a value that is proportional to the difference between a particular reference voltage value at which the horizontal calibration was conducted and the nominal reference voltage value.

14. The method of claim 12, further comprising updating, by the calibration circuit, the nominal reference voltage based on the calibrated reference voltage.

15. The method of claim 11, further comprising selecting, using the calibration circuit, the calibrated reference voltage based on a particular reference voltage value for which a corresponding one of the plurality of horizontal calibrations yielded a highest score.

16. The method of claim 11, wherein the method further comprises:
concurrent with performing the plurality of horizontal calibrations, initiating, by the calibration circuit a background calibration by sending a first command to the memory, wherein performing the background calibration comprises a ring oscillator implemented on the memory incrementing a counter in response to the first command.

17. The method of claim 16, further comprising:
sending, by the calibration circuit, a second command to the memory to complete the background calibration, wherein the memory is configured to convey a count value to the calibration circuit in response to receiving the second command; and
adjusting, by the calibration circuit, a write clock signal conveyed between the memory controller and the memory based on the count value.

18. A system comprising:
a memory subsystem including a memory coupled to a memory controller, wherein the memory controller includes a calibration circuit configured to perform reference voltage calibrations, wherein, in performing the reference voltage calibrations, the calibration circuit is configured to:
perform a plurality of horizontal calibrations at different reference voltage values, and wherein ones of the horizontal calibrations comprise determining a range of delay values applied to a data strobe signal at which valid data is read from the memory;
determine scores corresponding to ones of the plurality of horizontal calibrations, wherein a score for a particular one of the plurality of horizontal calibrations is based on a corresponding range of delay values and a reference voltage margin; and
select a calibrated reference voltage based on the scores corresponding to ones of the plurality of horizontal calibrations.

19. The system of claim 18, wherein, to determine a score for a particular horizontal calibration of the plurality of horizontal calibrations, the calibration circuit is configured to:
determine a preliminary score that is based on the range of delay values such that a greater range of delay values corresponds to a greater score; and
determine a penalty score that is based on a difference between a particular reference voltage value at which the horizontal calibration was conducted and a nominal reference voltage value;
wherein a score for the particular reference voltage value is calculated by subtracting the penalty score from the preliminary score.

20. The system of claim 19, wherein the penalty score is based on a value that is proportional to the difference between a particular reference voltage value at which the horizontal calibration was conducted and the nominal reference voltage value.

* * * * *